United States Patent [19]
Bishop et al.

[11] Patent Number: 5,830,611
[45] Date of Patent: Nov. 3, 1998

[54] USE OF DIFFRACTED LIGHT FROM LATENT IMAGES IN PHOTORESIST FOR OPTIMIZING IMAGE CONTRAST

[76] Inventors: Kenneth P. Bishop, 376 Alda Rd. SE., Rio Rancho, N. Mex. 87124; Lisa M. Milner, 2733 Pennsylvania St. NE., Albuquerque, N. Mex. 87110; S. Sohail H. Naqvi, 1028 Tulane Dr. NE., Albuquerque, N. Mex. 87106; John R. McNeil, 13423 Desert Hills Pl. NE., Albuquerque, N. Mex. 87111; Bruce L. Draper, 7827 Pioneer Trail NE., Albuquerque, N. Mex. 87109

[21] Appl. No.: 847,618
[22] Filed: Mar. 5, 1992
[51] Int. Cl.$^6$ .................................................. G03F 7/207
[52] U.S. Cl. ........................... 430/30; 430/311; 430/394
[58] Field of Search ............................. 430/30, 311, 394, 430/395

[56] References Cited

U.S. PATENT DOCUMENTS

| 3,708,229 | 1/1973 | Pircher | 356/355 |
| 4,647,172 | 3/1987 | Batchelder | 430/30 |
| 5,124,216 | 6/1992 | Giapis | 430/30 |

FOREIGN PATENT DOCUMENTS

| 1165116 | 6/1989 | Japan | 430/30 |

*Primary Examiner*—Kathleen Duda
*Attorney, Agent, or Firm*—Snell & Wilmer L.L.P.

[57] ABSTRACT

The present invention includes a method and apparatus for the rapid, nondestructive evaluation of the contrast of a latent image in a photoresist. More particularly, the contrast of the latent image is directly monitored by measuring the intensity of the light diffracted from a pattern in the exposed, undeveloped photoresist known as the latent image. The proper exposure tool parameters, such as exposure tool time and focus, is suitably determined based on the intensity of different orders of diffracted light, namely the 2nd-order diffracted from the latent image. In a preferred embodiment, a test pattern consisting of a periodic pattern, or a pattern of the device associated with the particular lithographic step, is employed to provide well-defined diffraction orders.

8 Claims, 18 Drawing Sheets

USE OF DIFFRACTED LIGHT FROM LATENT IMAGES IN PHOTORESIST FOR OPTIMIZING IMAGE CONTRAST

BACKGROUND OF THE INVENTION

In microelectronics manufacturing photoresist exposure during lithography is a difficult processing step to satisfactorily control. The shape of the developed photoresist depends directly on the image contrast which is produced in the exposed, undeveloped photoresist. This image is also known as the latent image in the (undeveloped) photoresist. Two aspects of the exposure process largely determine the image contrast of the latent image: the amount of light absorbed by the photoresist during exposure, called the exposure dose, and the placement (in three dimensions) of the image which is being exposed in the photoresist. The former has recently been discussed in patent application Ser. No. 07/662,676, filed on Feb. 28, 1991. The image placement in the photoresist consists of proper placement in the plane parallel to the photoresist-covered surface, as well as proper placement in the direction normal to the same surface (i.e. the z-direction), which is normally associated with the focus of the exposure tool. The term "exposure tool" is used generally to describe what is also sometimes referred to as a stepper, a printer, or a scanner. This invention deals with monitoring the image contrast in the latent image of the undeveloped photoresist and controlling the focus conditions of the exposure tool to optimize the image contrast, thus enabling the optimal shape of the developed photoresist to be obtained.

Presently there is no commercially available direct (in-situ or otherwise) monitor of the latent image contrast and focus conditions of the exposure tool. The exposure tool focus and exposure time which are used for a specific situation are determined by calibration techniques. For example, test wafers which are coated with photoresist are exposed with the pattern of interest in a matrix of exposure times and exposure tool focus conditions. These test or "send-ahead" wafers are then developed and examined (e.g. by using scanning electron microscope techniques) to determine the resultant critical dimensions (CDs) in the photoresist. The optimal exposure and focus conditions are then selected for subsequent use on production wafers. However, because this technique does not involve direct monitoring of the contrast of the exposed photoresist, the exposure tool cannot adapt to variations in process parameters which change the conditions of exposure and focus which are required to achieve optimum image contrast. Slight variations in wafer processing which precede a lithography step can influence the optical and mechanical properties of a semiconductor wafer (e.g. thickness of transparent films on the wafer, wafer flatness, and surface roughness of films on the wafer), and this can deleteriously impact subsequent CDs of the developed photoresist and the material which is patterned. This technique is an "open-loop" control process. Note, too, that the optimal focus and exposure conditions of the exposure tool which are so determined using this calibration technique are the result of the entire sequence of events involved in processing the photoresist. In particular, there are processes subsequent to exposure (e.g. post-exposure-bake and development) which involve parameters that influence the final shape of the developed photoresist. The exposure and focus conditions which are determined to be optimal using the current calibration technique are so done to include the effects of these final processing steps subsequent to exposure. It is entirely possible that the conditions chosen as optimal are not the same as those which actually optimize the exposure process itself, exclusive of the following processing steps. Optimal shape of the developed photoresist will occur only if the conditions for each step of photoresist processing are optimal.

This problem is more acute given that design geometries of integrated circuits (ICs) are shrinking as levels of circuit integration increase. For example, CDs of 1 $\mu$m for current high performance devices are common, and some fabrication processes involve CDs of 0.7 $\mu$m. Future microelectronics production facilities involve design geometries shrinking from CDs of 0.7 $\mu$m to 0.35 $\mu$m and smaller. CDs of 0.1–0.2 $\mu$m are expected in the more distant future. At the same time, die sizes (i.e. individual exposure areas) are growing, bringing increased device count and integration. Increasing wafer diameters (certainly to 10" diameter and probably to 12" diameter) and increasing automation are also expected, particularly in the lithography sector of the manufacturing process.

This increased level of integration and reduction in CD places increased demands on fabrication process control. Lithography occurs a number of times throughout integrated circuit (IC) fabrication. Estimates are that a wafer spends as much as 50% of its time in the lithography sector during microelectronics manufacturing. The dimensions (i.e., CDs) of the lines in the different patterns which are transferred must be precisely controlled throughout the fabrication process, otherwise device yield and performance suffer. The acceptable tolerance for deviations in CD is typically 10% to 20% of the CD itself, resulting in required CD control of 0.035 $\mu$m or smaller for CDs of interest now and in the near future.

The formation of latent images in photoresist, and the complex interrelation of latent image contrast and exposure tool parameters have been widely investigated and reported for the past five years or longer; see for example C. A. Mack, "Understanding Focus Effects in Submicron Optical Lithography" in Proc. SPIE Vol. 922, Optical/Laser Microlithography pp 135–148 (1988), C. A. Mack and P. M. Kaufman, "Understanding Focus Effects in Submicron Optical Lithography, Part 2: Photoresist Effects", Proc. SPIE Vol. 1088, Optical/Laser Microlithography II, pp. 304–323 (1989), and T. A. Brunner, J. M. Lewis, and M. P. Manny, "Stepper Self-Metrology Using Automated Techniques" in Proc. SPIE Vol. 1261, Integrated/Circuit Metrology, Inspection, and Process Control IV, pp. 286–297 (1990). One prior art technique which applies light scatter techniques to monitor latent images in photoresist is described by T. E. Adams, "Applications of Latent Image Metrology in Microlithography", in Integrated Circuit Metrology, Inspection and Process Control, Proc. SPIE vol. 1464, pp. 294–312 (1991). The experimental arrangement is illustrated in FIG. 6. Specifically, the Adams arrangement incorporates a lens 101 through which the incident beam and the diffracted light pass. The diffracted light which is collected by lens 101 is directed to a single detector 102, thus creating a single integrated signal which can be used for analysis. It can be seen that the intensity of the ±1st-order diffracted beams are a factor of 100 to 1000 larger than the intensity of the ±2nd-order diffracted beams. Because of this large difference, in using the single detector arrangement any effects which manifest themselves in intensity variations of the ±2-order beams go unnoticed and cannot be resolved using the single detector arrangement illustrated in FIG. 6. Also, this prior art arrangement does not provide for detection of the 0-order, or specular (i.e. direct reflected) light. Instead, this light passes through a hole in the mirror 103 and is directed back to the source. This represents information concerning the optical properties of the sample which is lost.

Another aspect of the Adams arrangement is the lens 101; the lens fixes the f-number of the detection arrangement to a value considerably less than 1. There is no flexibility to change the numerical aperture of the detection system to accommodate, for example, small pitch structure which might diffract light at large angles past the lens and therefore go undetected. Note that the vertical position of the lens 101 is quite restricted because of the requirement that the 0-order (direct reflected) light must pass through the hole in the mirror 103. The lens 101 must be located a distance from the sample approximately equal to its focal length. Otherwise the direct reflected beam will not be recollimated on its passage through the lens 101 and therefore not be substantially passed through the hole in the mirror 103.

The latent image is defined by the distribution of photoactive compound (PAC) concentration within a photoresist layer which is formed because of an exposure to radiation of the appropriate wavelength. This represents a change in chemical distribution inside the photoresist which is induced by the effect of the aerial image projected by the exposure tool. The index of refraction in the photoresist is linearly dependent on the PAC concentration, and consequently it is a function of both exposure and focus. A latent image grating is formed by exposing the photoresist using a grating photomask in the exposure tool, thereby causing a periodic variation in the PAC concentration. If we consider two samples exposed with a grating image for different amounts of time or using different focus values, the three-dimensional distribution of refractive indices of the photoresist will be different for the different regions of the phase grating created inside the photoresist. The PAC concentration then forms the basis for the pattern of the photoresist which is subsequently formed as a result of post-exposure baking and development. Note that these processing steps which follow the exposure also influence the shape of the developed photoresist.

SUMMARY OF THE INVENTION

In accordance with the present invention, rapid, nondestructive evaluation of the contrast of the latent image in photoresist is accomplished. The contrast of the latent image is directly monitored. Measurement is made of the intensity of the light diffracted from the pattern in the exposed, undeveloped photoresist, the so-called latent image. That is, proper exposure tool parameters such as exposure tool time and focus can be determined based on the intensity of different orders of diffracted light, particularly the 2nd- order diffracted from the latent image. In some instances, a test pattern consisting of a periodic pattern may be employed which provides well defined diffraction orders, or the pattern might be that of the device associated with the particular lithographic step.

In general, the technique of the invention can also be adapted to a periodic structure which provides a more complex scattering pattern. Thus the technique of the invention provides either at-line or on-line monitoring of diffraction or scattering from structures of the same scale as the device CD, an important factor for predicting proximity effects of subsequent pattern transfer. The technique of the invention is direct, simple, and fast. Also measurements are made on undeveloped photoresist—a very distinct advantage. Measurements can be made sufficiently fast to allow rapid control of the exposure conditions which influence image contrast, such as focus, and might be accomplished on the production line. The measurement can be made after an exposure, and corrections to the exposure conditions (e.g. focus) for subsequent exposures may be derived to compensate for slowly changing optical or mechanical properties of the wafer. Also, the technique of the invention may be used with a variety of photoresist materials under varying conditions.

BRIEF DESCRIPTION OF THE DRAWINGS

Reference is now made to the drawings in which like reference numerals represent like parts and in which.

DETAILED DESCRIPTION OF THE INVENTION

Figure 1:
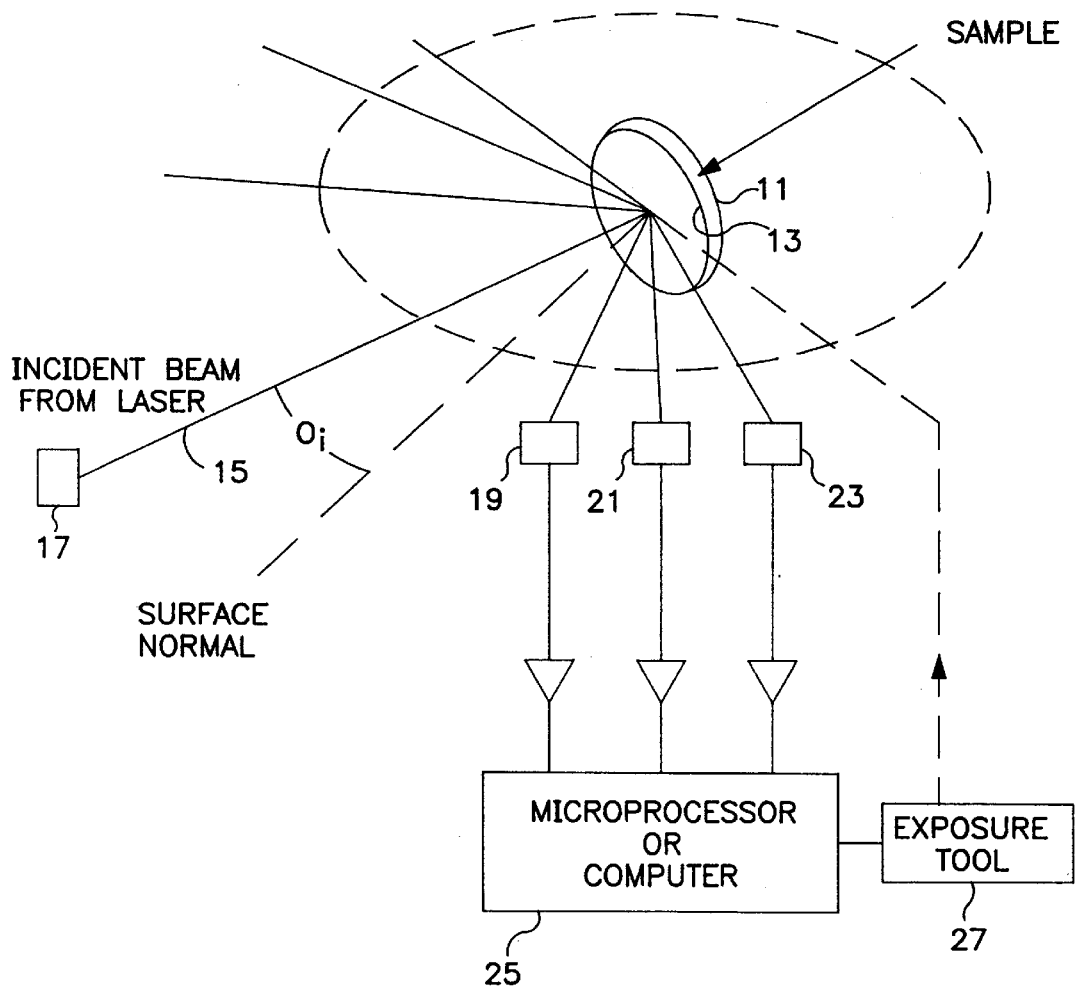
FIG. 1 is a diagrammatic view of a measuring arrangement in accordance with an embodiment of the invention.

Optical projection lithography simulation tools such as SAMPLE and PROLITH are commonly used to model the effect of focus and exposure time on the PAC concentration; see O. D. Crisalle, S. R. Keifling, D. E. Seborg, and D. A. Mellichamp, "A Comparison of the Optical Projection Lithography Simulators in SAMPLE and PROLITH", in Microelectronics Integrated Processing:Growth, Monitoring, and Control, Proc. of SPIE Vol. 1185, pp. 171–187 (1989). The PAC concentration within a photoresist layer is the result of several factors in the sequence of processing steps leading up to and including the final development of the resist. The relationships between factors which involve the exposure tool, and the amount of light diffracted into the various orders from a latent image of a periodic structure (e.g. a grating) are accomplished by this invention. This is done by incorporating a diffraction model which is interfaced with one of the simulation tools mentioned. The diffraction model is based on rigorous coupled-wave diffraction theory developed by M. G. Moharram and T. K. Gaylord, "A Diffraction Analysis of Dielectric Surface-Relief Gratings", J. Opt. Soc. Am Vol 72, pp 1385–1392 (1982). An overview of this analysis is provided in patent application Ser. No. 07/662,676 and the references cited therein. The ability to model diffraction from a latent image of a grating relies on the fact that changes in the refractive index of the photoresist occur as the result of exposure at absorbing wavelengths. As described by C. A. Mack, 1988 and by T. E. Adams, 1991, the refractive index and the PAC concentration of the photoresist change with exposure dose. According to the present invention, this provides a capability to model the effects of exposure tool parameters (e.g. focus and exposure time) on the intensity of light in the different orders which are diffracted by the latent image in the photoresist.

The optimal contrast of the latent image is obtained when the image is formed at a location, or focal position, z, which is located within the photoresist; C. A. Mack, 1988, describes this location as approximately ⅓ to ½ the thickness of the photoresist relative the top of the photoresist. As discussed by Mack, a commonly used metric of the image contrast used to expose the photoresist is specified in terms of the intensity of the aerial image l(x) at a particular position, x, in the x-y plane of the wafer for a pattern which is periodic in the x-direction. The definition commonly used to specify image contrast, C, is $$C = \frac{I(\max) - I(\min)}{I(\max) + I(\min)},$$

where l(max) represents the intensity of the aerial image at the position x corresponding to the center of the line of the periodic pattern, and l(min) corresponds to the intensity of the aerial image at the center of the space of the periodic pattern. However, because of standing waves in the z-direction of the aerial image, and therefore in the photoresist refractive index and PAC concentration after exposure, this definition of contrast is not sufficient to accurately describe the PAC concentration within the photoresist.

Well known lithography simulation tools such as SAMPLE and PROLITH can be used to predict the PAC concentration taking into account the standing waves. The present invention incorporates calculation of image contrast based upon an expression of contrast which is spatially-resolved in the z-direction to account for the effects of the standing waves mentioned. According to the invention there is incorporated an expression for contrast which represents the contrast of the PAC concentration, which is calculated at specific height, $z_i$, in the photoresist. Specifically, $C_{PAC}(z_i)$ is given in terms of the maximum and minimum PAC concentrations at $z_i$ ($m_{max}(z_i)$ and $m_{min}(z_i)$, respectively) as $$C_{PAC}(z_i) = \frac{m_{max}(z_i) - m_{min}(z_i)}{m_{max}(z_i) + m_{min}(z_i)}.$$

Because of the standing wave effects of the exposing radiation, $C_{pac}$ varies with z, and we thus use an average PAC concentration contrast in our invention given by $$C_{avg} = \frac{1}{N} \sum_{i=1}^{N} C_{PAC}(z_i).$$

This number, $C_{avg}$, represents a figure of merit for the overall contrast of the latent image; the larger $C_{avg}$ is, the larger the PAC gradient is in going in the x-direction of the line structure, and the greater the slope, or sharpness of the developed photoresist lines, which is the intended purpose of improving the lithography process.

The definition for $C_{avg}$ used in our invention more accurately relates the lithography simulation tool and the diffraction model than the simple contrast C. For example, the contrast C does not change with increasing exposure time, whereas in accordance with the invention, $C_{avg}$ does. This is very intimately connected with calculating the diffraction characteristics of a pattern in the photoresist, and thereby being able to optimize the exposure tool conditions (e.g. focus and exposure time).

Figure 2A:
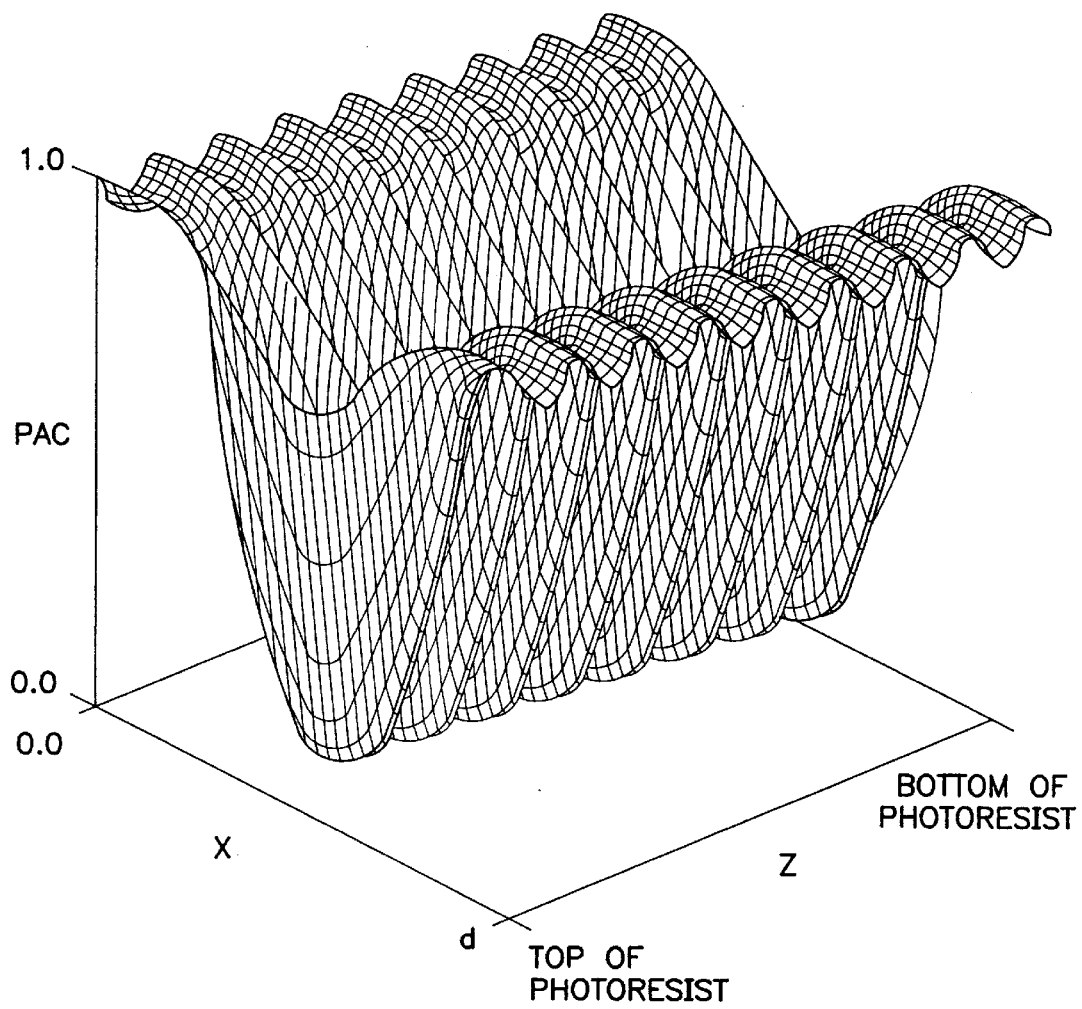
FIG. 2a is a graph of the PAC concentration in the x-z directions of photoresist.
Figure 2B:
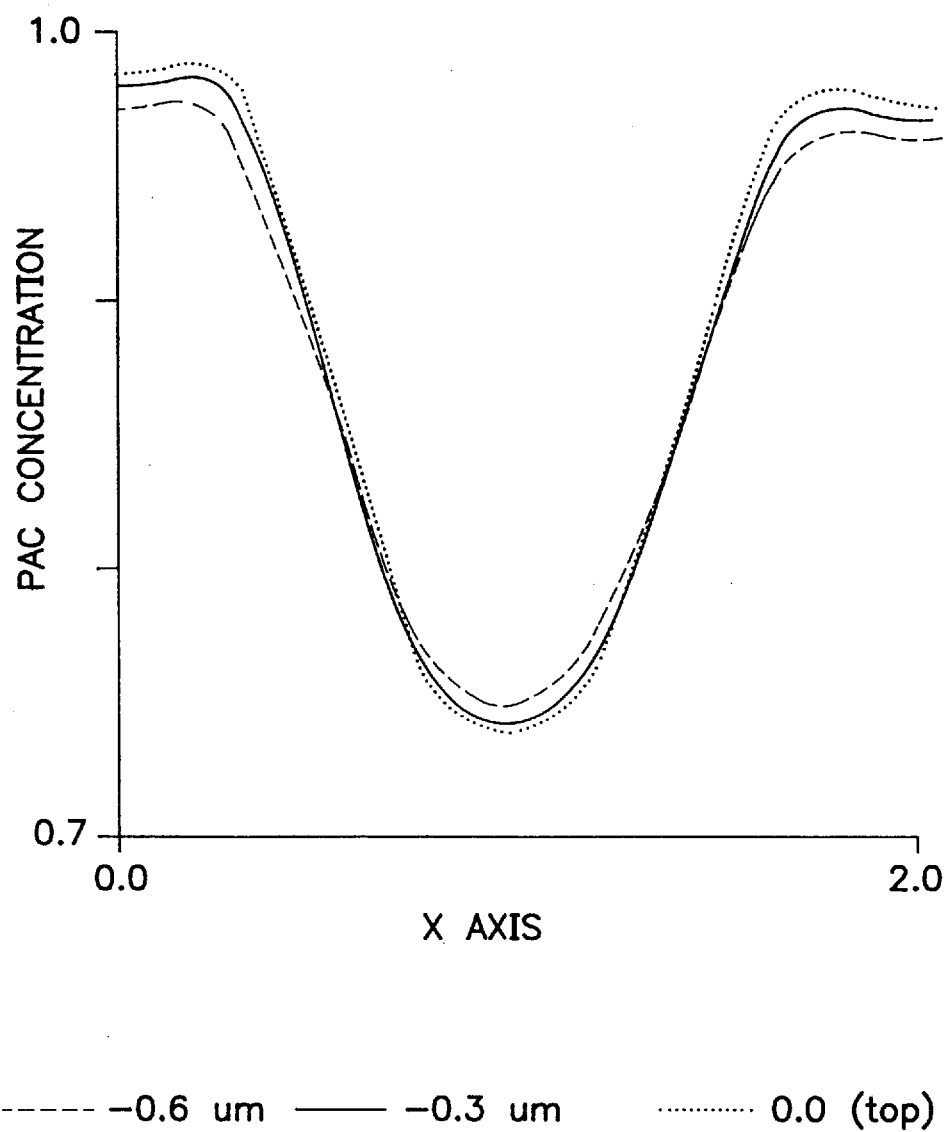
FIG. 2b is a graph of the PAC concentration in the x-direction at the top surface of photoresist for three focal positions.
Figure 2C:
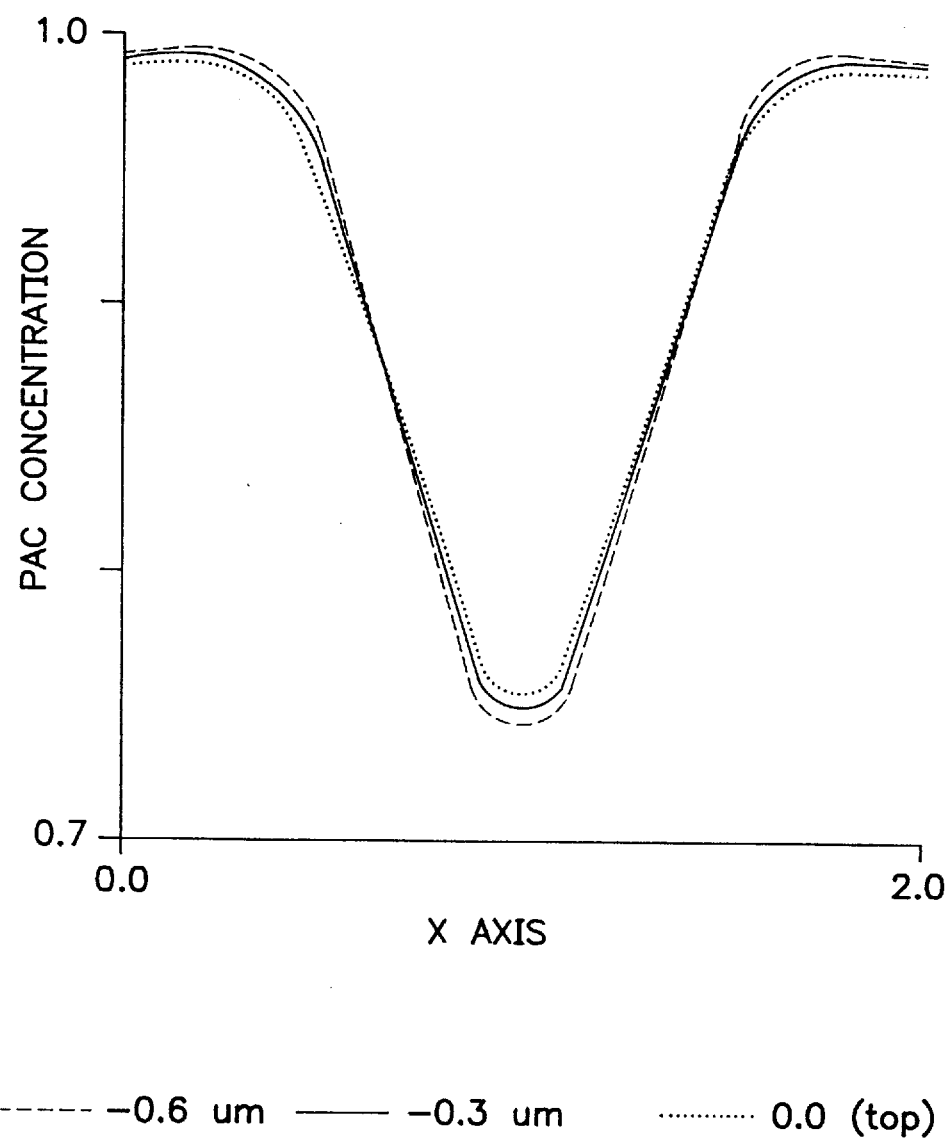
FIG. 2c is a graph of the PAC concentration in the x-direction at the bottom surface of photoresist for three focal positions.
Figure 2D:
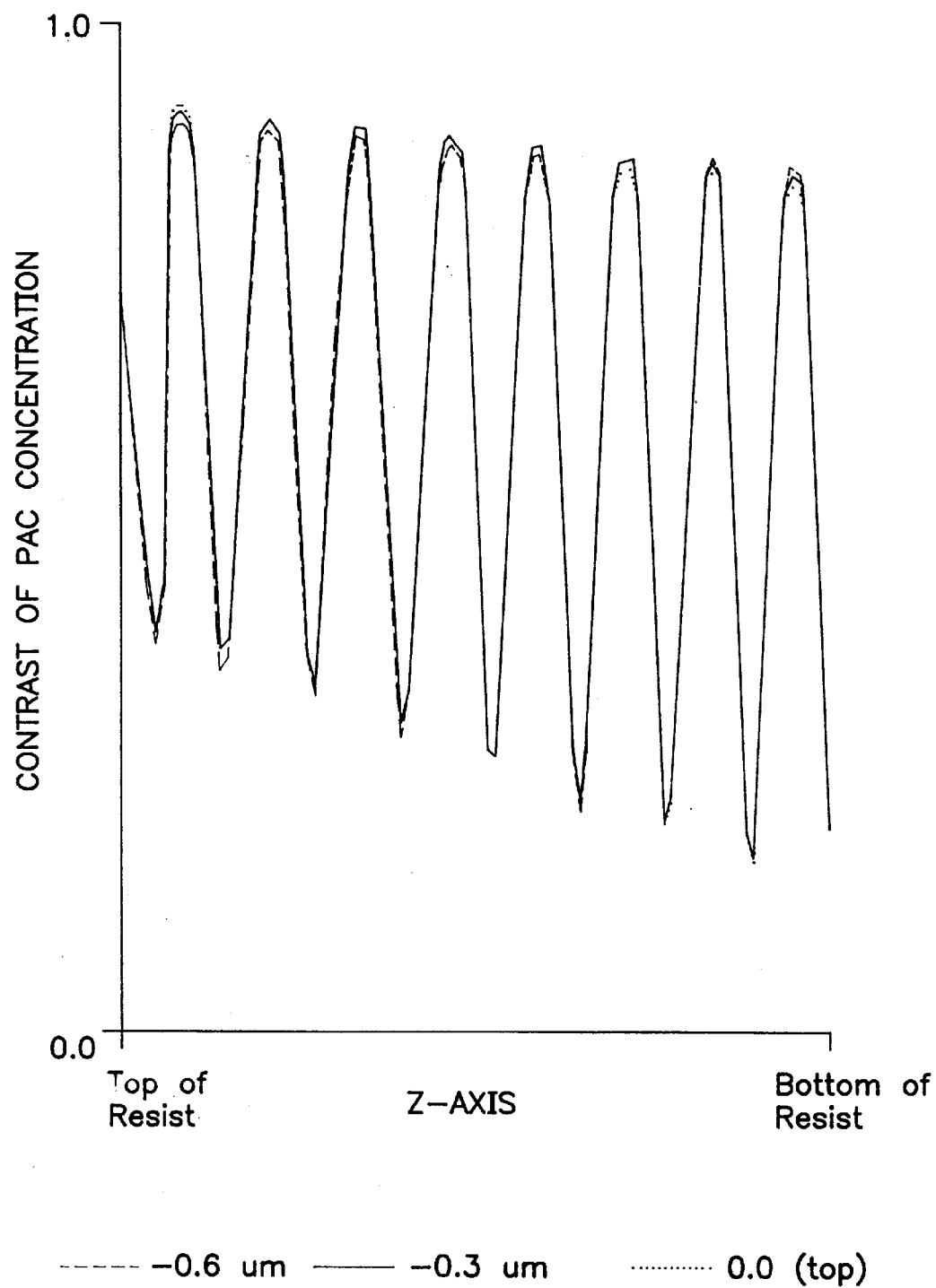
FIG. 2d is a graph of the PAC contrast versus depth in the photoresist layer, for three focal positions.

FIG. 2a illustrates results obtained using PROLITH to calculate the PAC concentration in a 1.1 μm thick layer of photoresist on a bare Si wafer; the concentration is calculated in the x- and z-directions. The undulations seen are the result of the interference effects of the standing waves of the exposing radiation. FIG. 2b illustrates the PAC concentration at the top of the photoresist layer as a function of the x-direction for three different focus conditions of the exposure tool. The PAC contrast (i.e., slope of the plot) for the focal position of 0.0 μm (i.e., focus is at the surface of the photoresist) is maximum at the top of the photoresist layer, while FIG. 2c shows that this focal position has the smallest PAC contrast at the bottom of the photoresist layer. Similarly, the contrast for the −0.6 μm focal position (i.e., focus is located approximately at the middle of the photoresist layer) has the largest PAC contrast at the bottom of the resist, and it has the smallest contrast at the top of the resist. FIG. 2d illustrates this in more detail by showing the PAC contrast throughout the resist. The focal position of −0.3 μm (i.e., focus is at a location approximately midway between the top and the middle of the photoresist layer) has the largest $C_{avg}$, as defined above, compared to the other two focal positions. In accordance with our invention, the optimal focal position as that which gives the largest $C_{avg}$ to produce optimal contrast of the latent image.

For the case of periodic structures (e.g., diffraction gratings) illuminated with a laser beam, the scattered field consists of distinct diffracted orders (e.g., 0-, 1st- and 2nd-orders) at angular locations specified by the grating equation. Photodetectors may be used to measure the power diffracted into these orders. The incident laser power is also recorded to provide a reference of incident power so that the fraction of incident power in each diffracted order can be accurately determined.

Referring to FIG. 1, a sample 11 having a photoresist layer 13 with latent image thereon receives an incident beam 15 from any suitable laser source with output at a wavelength which does not substantially expose the photoresist such as a He—Ne laser source 17 and specularly reflects the 0-order beam to a first detector 19 and reflects 1st- and 2nd-order diffracted beams to respective detectors 21 and 23. The outputs of the detectors 19, 21, and 23 are fed to respective amplifiers and then to a microprocessor or programmable computer 25 outfitted with measurement and comparator electronics of any suitable well-known design. The output of the microprocessor 25 may be utilized directly to provide detailed information of the exposed photoresist, or the output might be fed to the exposure tool 27 for controlling exposure tool parameters. The processor 25 provides a memory of tables or reference data, the use of which is governed by the signals fed from detectors 19, 21, and 23. For example, the 0-th order output from detector 19 provides a measure of thin film thickness; the output from 1st order detector 21 actuates reference data which matches pattern exposure and focus conditions versus 1st order diffracted power and provides input for the comparator function in the computer. The second order diffracted power from detector 23 is combined at the comparator with that based on 1st order detector 21 to provide additional information relative to the exposure tool focus condition. The combined effect of the processing of outputs from detectors 19, 21, 23 in processor 25 is to provide exposure and focus conditions to maximize $C_{avg}$, and thereby provide optimal developed photoresist structure.

In accordance with the invention, both methods of implementation, "at-line" and "off-line", described below, include the ability to monitor the incident beam intensity. Measurements of diffracted beam intensities by detectors 19, 21, and 23 are normalized to the incident beam intensity measured by detector 49 used in conjunction with beam splitter 50 to accommodate incident beam fluctuations. Microprocessor or computer 25 may be used for this purpose.

Advantageously, the detectors might be moved to any angle required to detect diffracted light. Also, the aperture of the individual detectors might be made as small as desired so that light is detected from substantially only a single diffracted beam if desired.

Using this arrangement, in accordance with this invention the intensities of the 1st- and 2nd-order beams diffracted from the latent image in the photoresist 13 are directly related to the $C_{avg}$ of the photoresist, and therefore related to the focal position and exposure time of the exposure tool. When the latent image pattern on the wafer is illuminated using a laser as illustrated in FIG. 1, the photoresist is not exposed because it is not sensitive at the laser wavelength used to illuminate the pattern. For example, when a He—Ne laser with output at 633 nm is used to examine Hunt 204 photoresist, the photoresist is sensitive at the 436 nm wavelength (g-line) used for exposure, but not at the 633 nm wavelength of the laser. As the wavelength-sensitive regions of photoresist progress toward shorter wavelengths for smaller CDs, shorter wavelength sources may be used for this monitoring function, providing higher resolution.

The angle of incidence, the wavelength, and the polarization of the incident beam can be varied. These parameters greatly influence the intensities of the beams diffracted from the latent image. The combination of varying the input beam wavelength, polarization and angle of incidence may allow additional details of the pattern to be characterized. The number of orders that is measured depends on the pitch of the periodic pattern, but in accordance with the invention measuring or characterizing the intensities of the 0-order, one of the 1st-order beams, and one of the 2nd-order beams is preferred. The minimum size of CD that can be characterized using the technique in accordance with the invention depends on the measurement sensitivity and is approximately 0.1 $\mu$m or smaller. Also, a periodic structure having this CD may be fabricated with a pitch of 1 $\mu$m or larger, so that the 2-order diffracted beams are easily characterized using visible light. The measured intensities of the diffracted beams are normalized to the incident beam intensity so that intensity variations of the incident beam do not provide false results.

The flexibility of the geometry of the invention illustrated in FIG. 1 permits the diameter of the illuminating incident light beam to be as large as several cm and as small as a few $\mu$m. In practicing the invention, it is preferred that the diameter of the incident beam should be such that a minimum of approximately 10 periods of the periodic structure are illuminated. In applications of the invention to microelectronics fabrication, for example, it is desirable to have the incident beam diameter less than 100 $\mu$m so that periodic patterns of this size might be used. Using this arrangement, it has been found that employing incident beam diameters as small as 36 $\mu$m and as large as 2 mm produce essentially equivalent results.

Figure 3A:
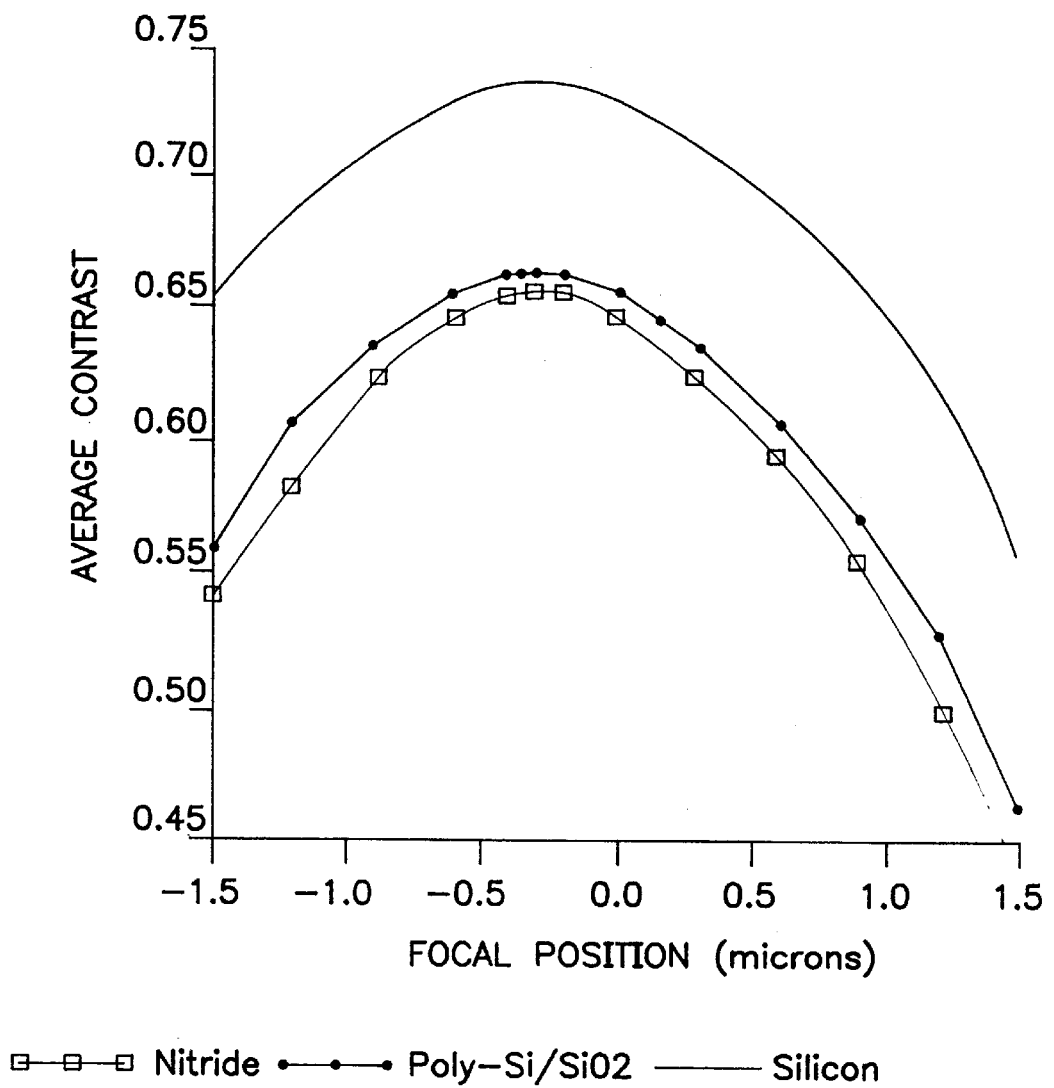
FIG. 3a is a plot of average contrast, $C_{avg}$, in photoresist versus focal position for three different wafer surfaces.

To further illustrate the working of our invention, the graph of FIG. 3a illustrates experimental data showing the dependence of $C_{avg}$ on focal position which is calculated using the procedure described previously in connection with FIGS. 2a, 2b, and 2c for three different wafer samples. Note that the focal position is defined such that 0.0 $\mu$m corresponds to the top or surface of the photoresist layer, −1.0 $\mu$m corresponds to the focal position being located at 1.0 $\mu$m depth (i.e., 1.0 $\mu$m inside the photoresist), and 1.0 $\mu$m corresponds to the focal position being located at 1.0 $\mu$m above the top or surface of the photoresist layer in the direction towards the exposure tool.

The three wafer samples were: photoresist on a bare Si wafer, photoresist on a $Si_3N_4$ layer 1.0 $\mu$m thick which was located on a Si wafer, and photoresist on a layer of polycrystalline Si 0.25 $\mu$m thick on a layer of $SiO_2$ 0.155 $\mu$m thick which was located on the Si wafer. The photoresist layer was 1.10 $\mu$m thick in all three samples. The exposure doses used to model this behavior were 150 mJ/cm$^2$ for the first sample, 110 mJ/cm$^2$ for the second sample, and 120 mJ/cm$^2$ for the third sample. These exposure doses are optimal for each sample structure and depend upon the optical properties of each sample, as discussed in previously mentioned patent application Ser. No. 07/662,676. These sample wafer surfaces are typical of those encountered in microelectronics processing in which the sample must undergo lithography.

It can be seen in FIG. 3a that $C_{avg}$ reaches a maximum value in the case of all three samples for a focal position of approximately −0.3 $\mu$m (i.e. below the surface of the photoresist). This is consistent with experimental observations of C. A. Mack, 1988 and T. E. Adams, 1991.

Figure 3B:
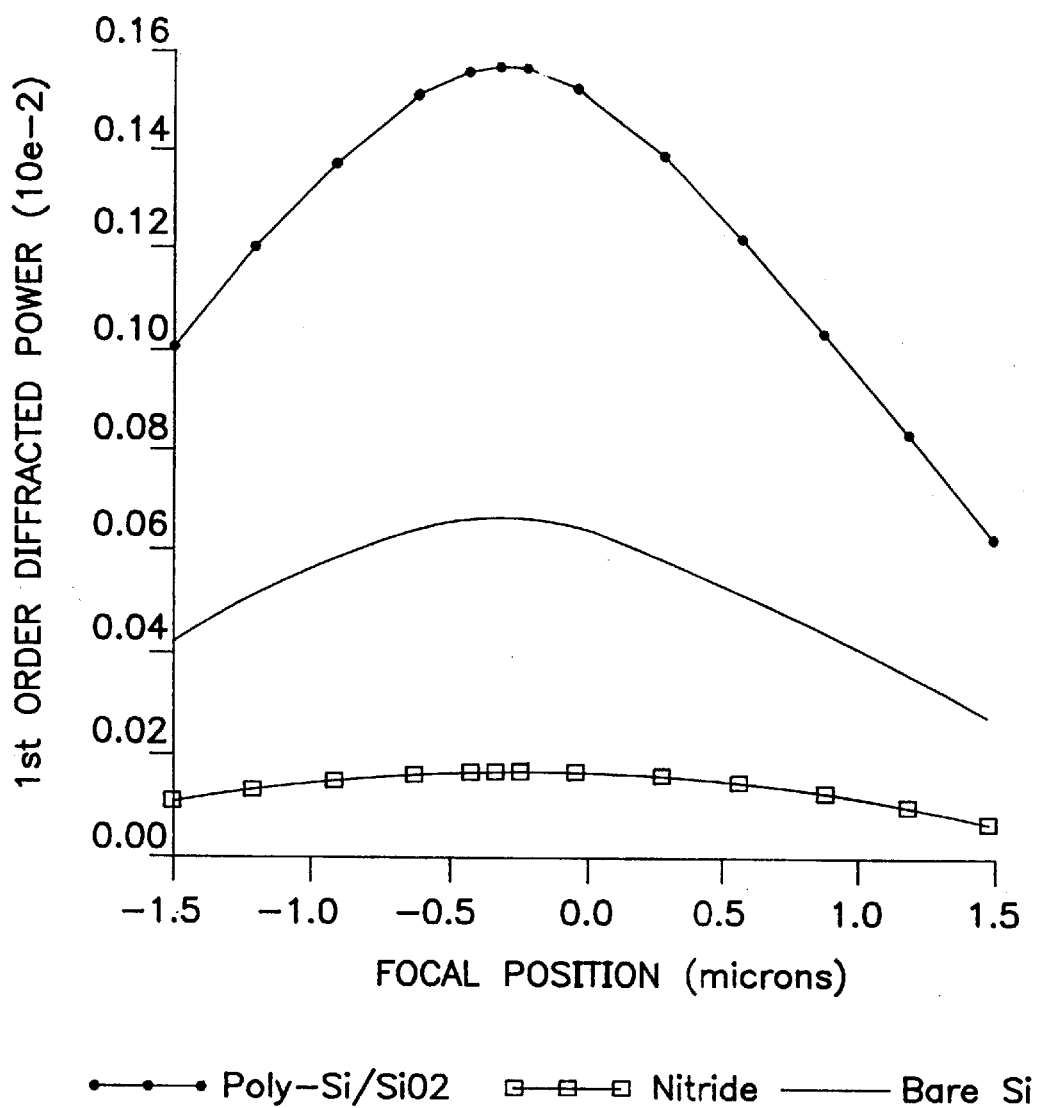
FIG. 3b is a plot of calculated 1st-order diffracted intensity versus focal position for three different wafer surfaces.

FIG. 3b illustrates the intensities of the 1st-order diffracted beams from latent images calculated in accordance with the process described above. This is illustrated for the same three sample structures as discussed in connection with FIG. 3a, with respect to changes in the focal position of the exposure tool. The diffracted intensities are normalized with respect to the incident beam intensity. The latent image is a periodic structure (i.e. a grating) having a linewidth of 1.0 $\mu$m and a pitch (period) of 2.0 $\mu$m. The diffracted intensities are normalized to the intensity of the incident beam. The diffracted intensities reach a maximum at the focal position of approximately −0.3 $\mu$m, the same as that for $C_{avg}$ as illustrated in FIG. 3a.

Figure 3C:
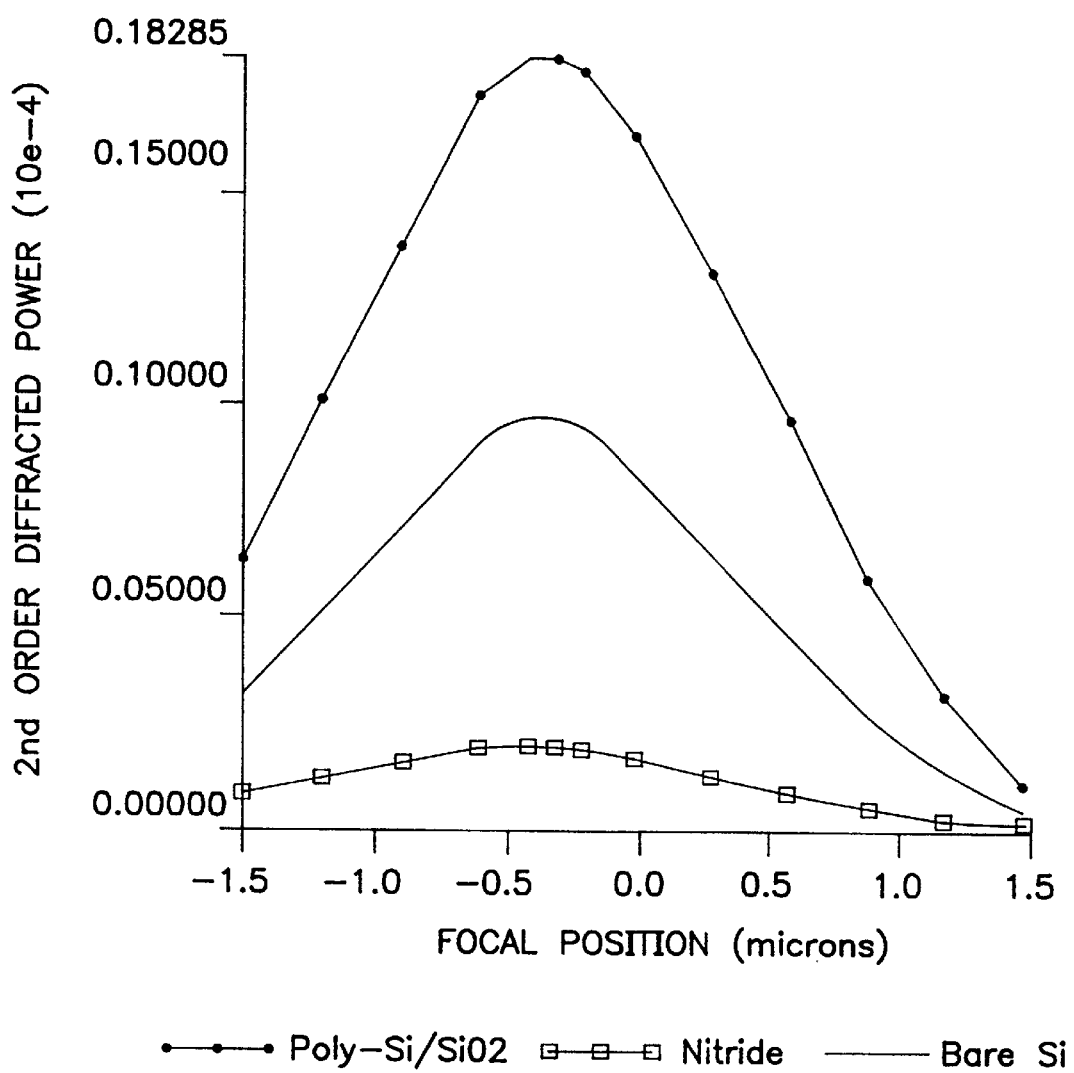
FIG. 3c is a plot of calculated 2nd-order diffracted intensity versus focal position for three different wafer surfaces.

FIG. 3c illustrates the variation of the intensities of the 2nd-order diffracted beams from the same latent images as those of FIG. 3b, plotted versus the focal position of the exposure tool. The 2nd-order beam intensity from the bare Si wafer coated with photoresist reaches a maximum at a focal position of approximately −0.3 µm, as in FIG. 3b. The 2nd-order beam intensity diffracted from the other two samples reaches a maximum at a focal position of approximately −0.4 µm, slightly different from the focal position which causes $C_{avg}$ to peak. This small difference is specific to the structure of the sample under investigation. It can be calibrated using test samples and be treated as a constant off-set in the focal position actually utilized. This clearly illustrates that monitoring the intensities of the 1st-and 2nd-order beams diffracted from a latent image in photoresist can be utilized to indicate optimal focal position, and thus to optimize latent image contrast. From FIGS. 3b and 3c, it can be seen that the 2nd-order intensities have greater variation with changes in focal position than the 1-st order intensities. In particular, the 1-st order intensities change by less than a factor of two over the range of focal positions indicated. The 2nd-order intensities change by more than a factor of two, and therefore in accordance with the invention have greater sensitivity to focal position than the 1st-order intensities.

Figure 4A:
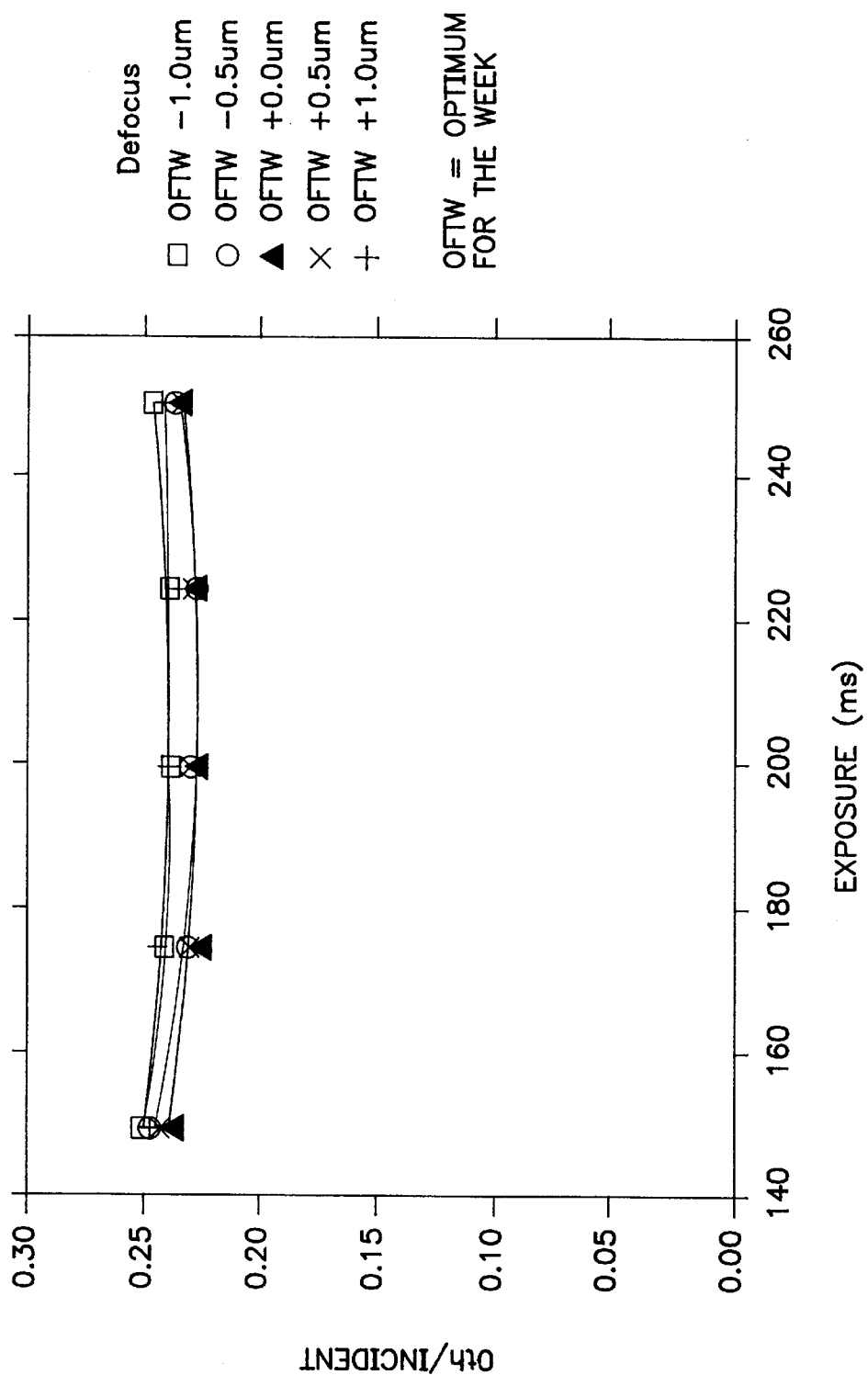
FIG. 4a is a plot of measured 0-order intensity versus exposure time of light diffracted from a latent image structure, for five different focal positions.
Figure 4B:
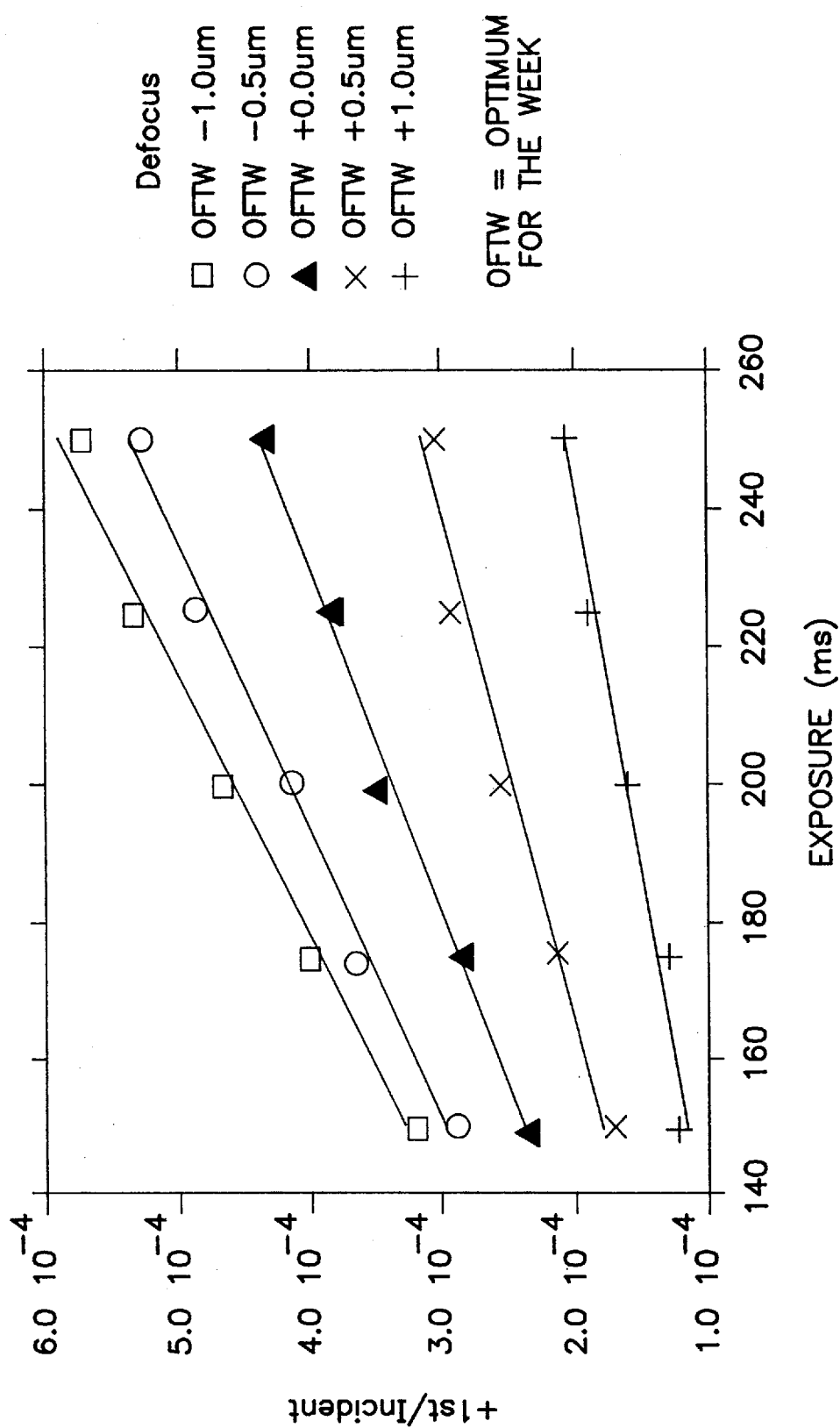
FIG. 4b is a plot of measured 1st-order intensity versus exposure time of light diffracted from a latent image structure, for five different focal positions.
Figure 4C:
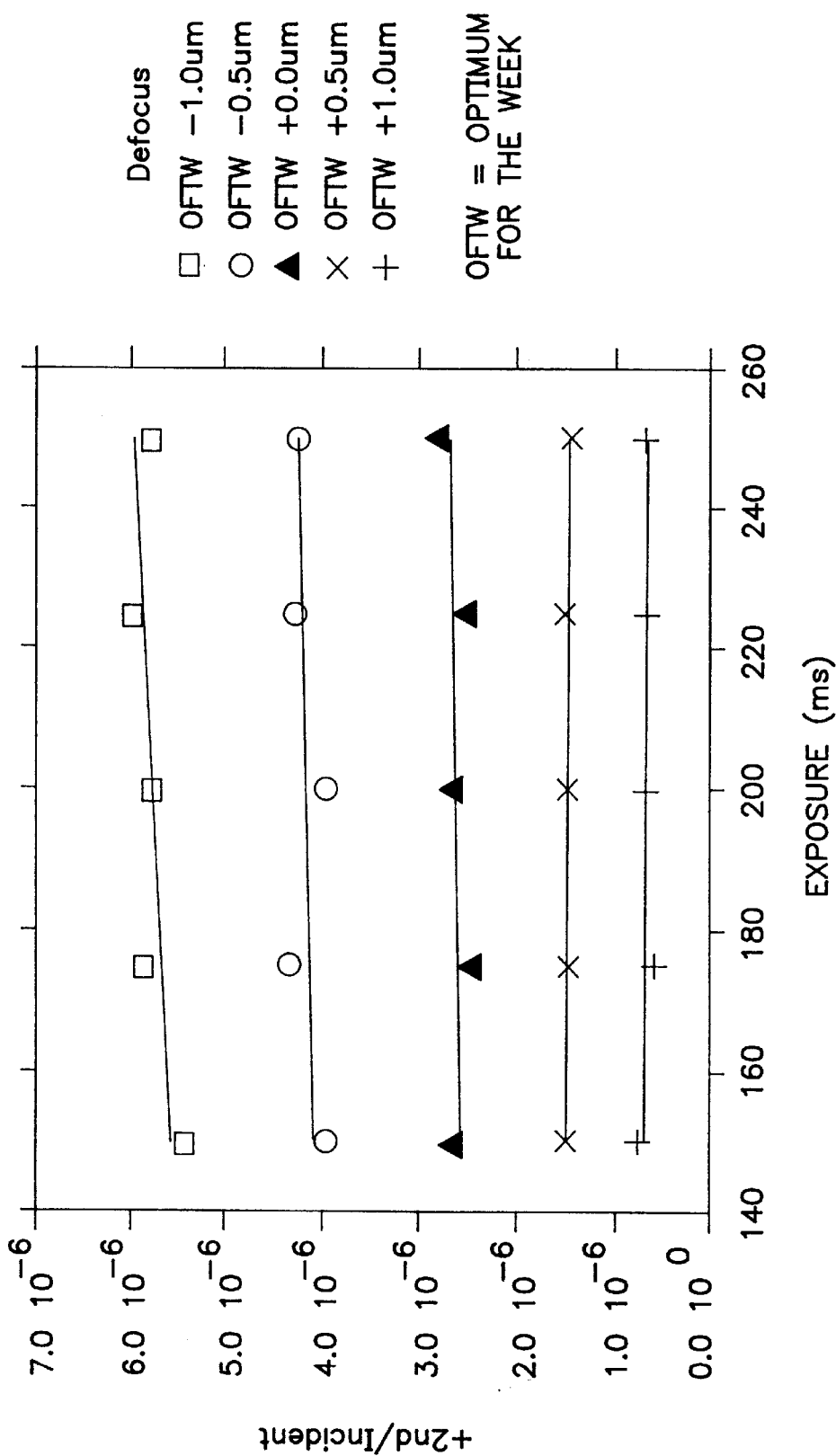
FIG. 4c is a plot of measured 2nd-order intensity versus exposure time of light diffracted from a latent image structure, for five different focal positions.

FIGS. 4a–4c illustrate experimental data resulting from characterizing the light diffracted from a latent image in photoresist on a bare Si wafer, corresponding to one of the samples discussed in connection with FIG. 3. The data is plotted in a different format than that in FIG. 3 to further illustrate invention. In particular, the intensities of three diffraction orders (0-, 1st-, and 2nd-orders) are plotted versus exposure time for five different focal positions. The diffracted intensities are normalized to the intensity of the incident beam. The horizontal axis in each plot (exposure time) is directly related to the exposure dose discussed in connection with FIG. 3 (mJ/cm$^2$) by a multiplicative constant (mW/cm$^2$) representing the light intensity used for exposure (i.e. mJ/cm$^2$=mW/cm$^2$×t). This constant is specific to the exposure tool used to generate the data and is dependent upon the light source used in the exposure tool and the optical properties of the exposure tool. Each focal position is referred to as defocus and is labeled "OFTW+x µm" (x=−1.0 µm through+1.0 µm), where "OFTW" is used to indicate the optimal focal position found for the week prior to making the exposures. In FIG. 4a it can be seen that the intensity of the 0-order diffraction is insensitive to exposure time and focal position. This behavior is consistent with the discussion in the previously mentioned patent application Ser. No. 07/662,676, in which it was illustrated that the 0-order intensity is sensitive to the optical properties of the underlying structure of the sample (e.g. photoresist and film thickness) and not sensitive to the properties of the latent image which result from the exposure time and focal position used. It was discussed that this insensitivity can be utilized to determine the thickness of the photoresist and underlying films.

In FIG. 4b it can be seen that the 1st-order intensity is sensitive to the exposure time, and this is consistent with patent application Ser. No. 07/662,676 in which it was discussed that 1st-order intensity can be utilized to determine optimal exposure time and exposure dose. Also FIG. 4b illustrates the variation of 1st-order diffraction intensity with focal position, and this is consistent with the behavior illustrated in FIG. 3.

Figure 4D:
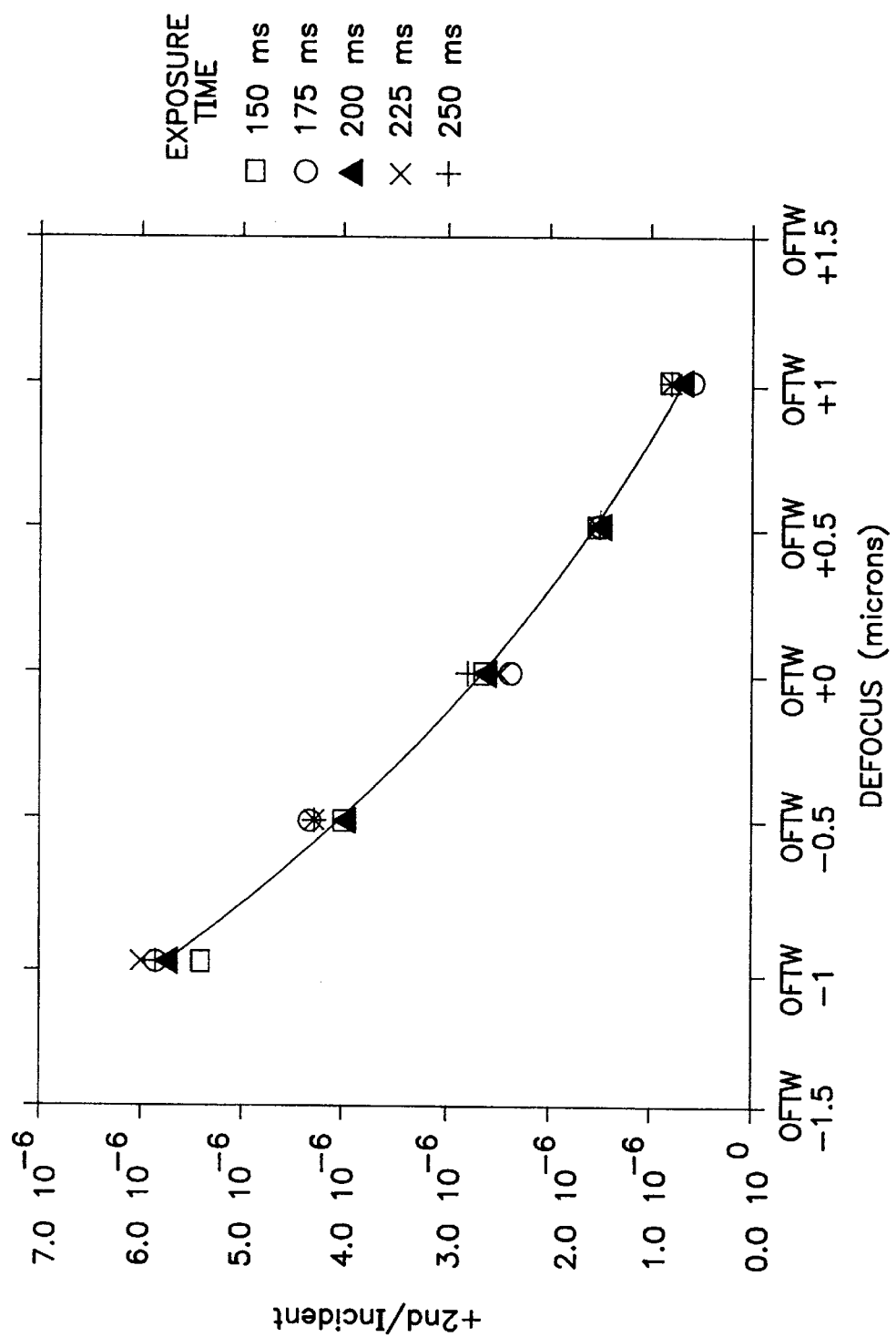
FIG. 4d is a plot of measured 2nd-order intensity versus focal position of light diffracted from a latent image structure, for five different exposure times.

FIG. 4c illustrates the variation of 2nd-order diffracted intensity with exposure time and focal position. First, it can be seen that there is very little change in 2nd-order diffracted light intensity with changing exposure time. In accordance with the invention, this insensitivity of the 2nd-order diffraction to exposure time can be utilized to determine focal position of the exposure tool because the effects of these two parameters are effectively decoupled. The same data which is plotted in FIG. 4c is plotted in FIG. 4d to better illustrate the insensitivity of the 2nd-order diffracted intensity to exposure time. In FIG. 4d the horizontal axis is focal position, or defocus, extending from OFTW −1.5 µm to OFTW+1.5 µm, and the vertical axis is the same as in FIG. 4c.

Figure 4E:
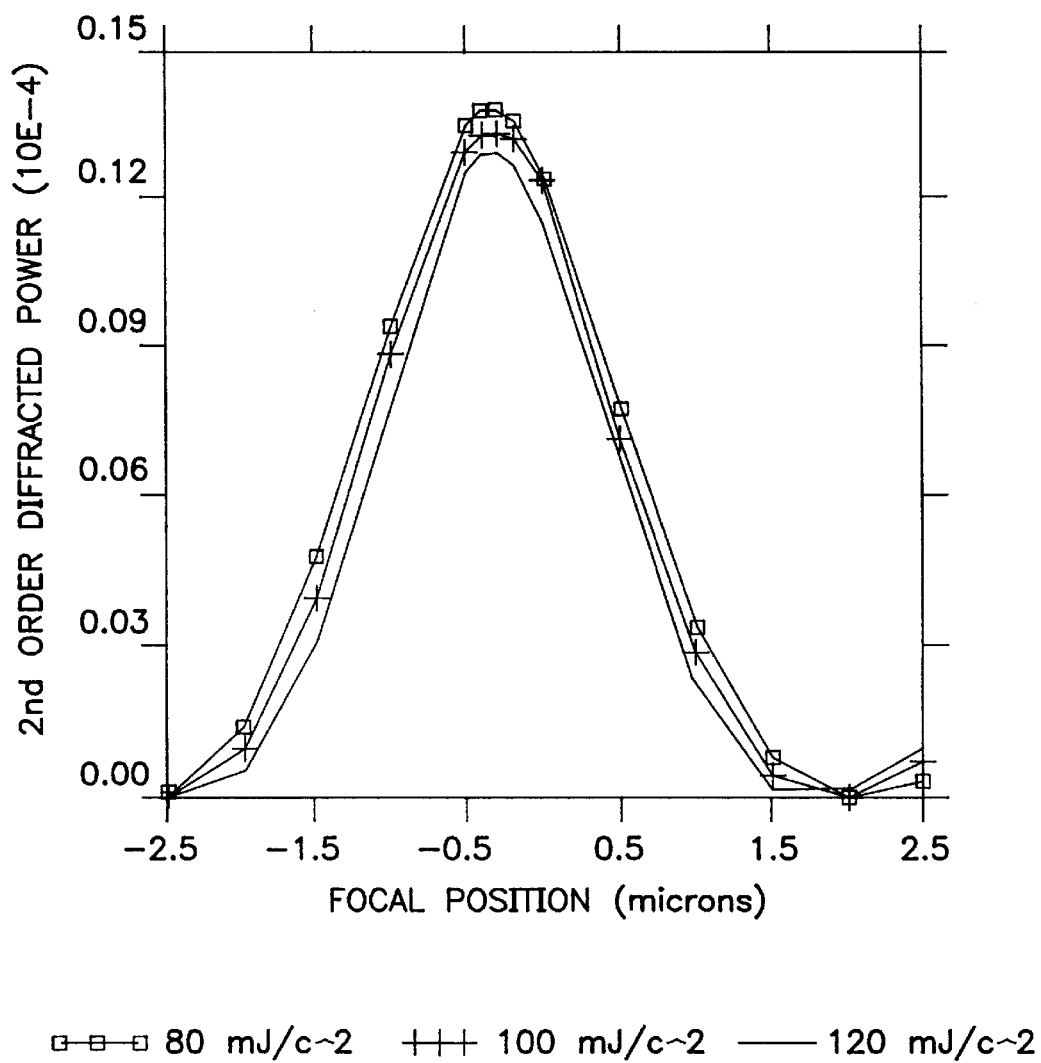
FIG. 4e is a plot of calculated 2nd-order intensity versus focal position of light diffracted from a latent image structure, for three different exposure doses.

FIG. 4e represents results of calculations performed in accordance with this invention which are consistent with the experimental data illustrated in FIG. 4c. The horizontal axis of FIG. 4e has units of J/cm$^2$ and is related to exposure time in the same manner discussed previously in connection with FIGS. 4a–4c. In FIG. 4e it can be seen that there is substantially no change in the intensity of the 2nd-order diffracted beam for the three exposure doses indicated.

FIGS. 4b and 4c also illustrate the fact that the focal position of the exposure tool was not optimal at the time the exposures were made to fabricate the samples discussed in connection with these two figures. This can be understood by realizing that the diffracted intensities in both figures for a defocus of OFTW−1.0 µm is greater than that for the other focal positions. If the focal position were indeed optimal, and the exposure tool were properly adjusted, the diffracted intensities for the 1st- and 2nd-order beams would be maximum for a defocus setting of OFTW+0.0 µm.

Information presented in FIGS. 4a–4c can be applied in several ways. The simplest application is to characterize the calibration ("send-ahead") wafers mentioned previously. Analysis using our invention is performed in minutes rather than hours, as is the current requirement when using SEM analysis of wafers. Analysis in accordance with our invention can be applied in an "at-line" manner in conjunction with the exposure tool to control the exposure process and is discussed below in detail. Information gained from the analysis of an exposure is fed back to the exposure tool to provide corrections in exposure tool focus and exposure time conditions for subsequent exposures. The number of exposures between the analysis of one sample and a subsequent exposure which utilizes the analysis performed on the first sample might be as few as zero.

Figure 5A:
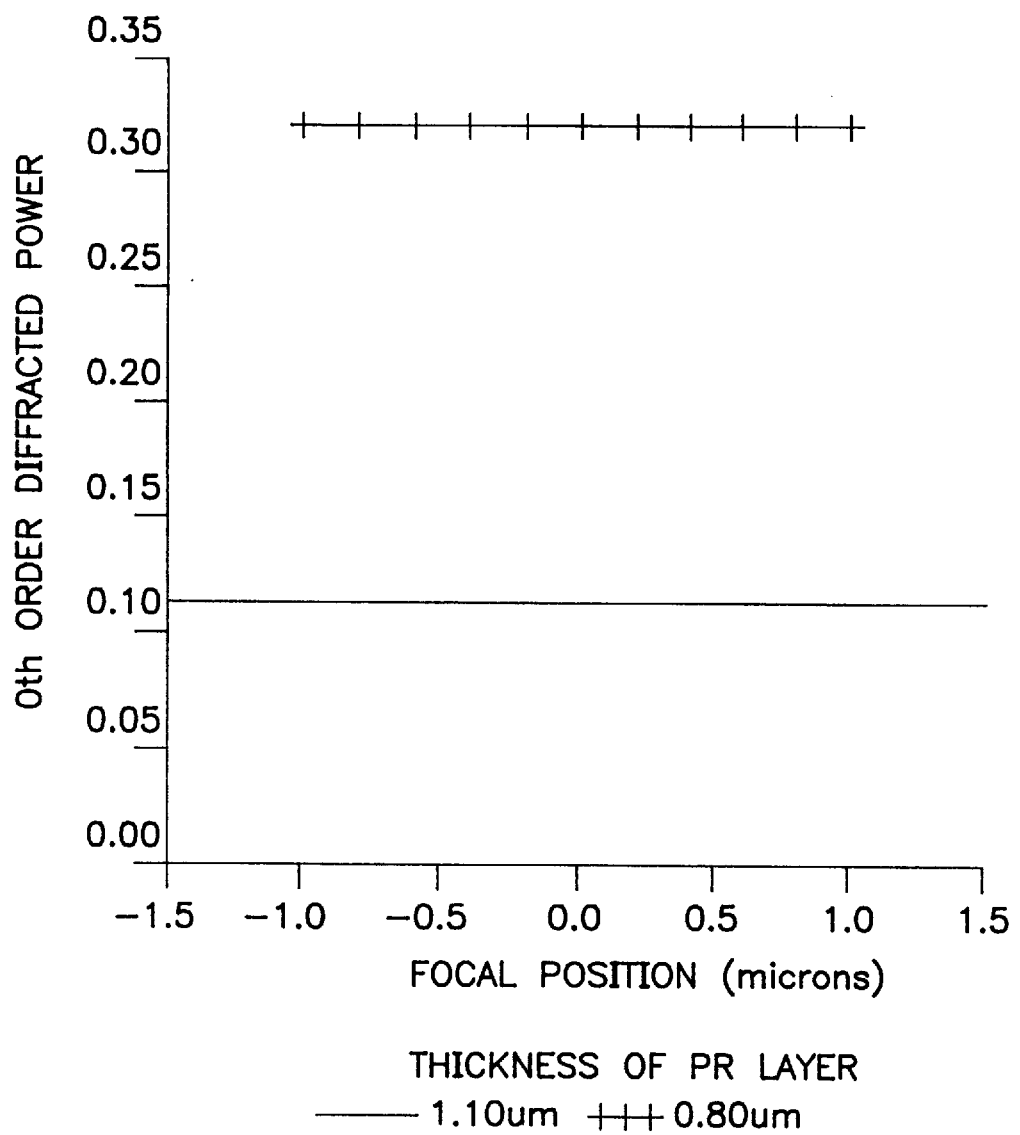
FIG. 5a is a plot of calculated 0-order intensity versus focal position of light diffracted from a latent image structure, for photoresist of two different thicknesses.
Figure 5B:
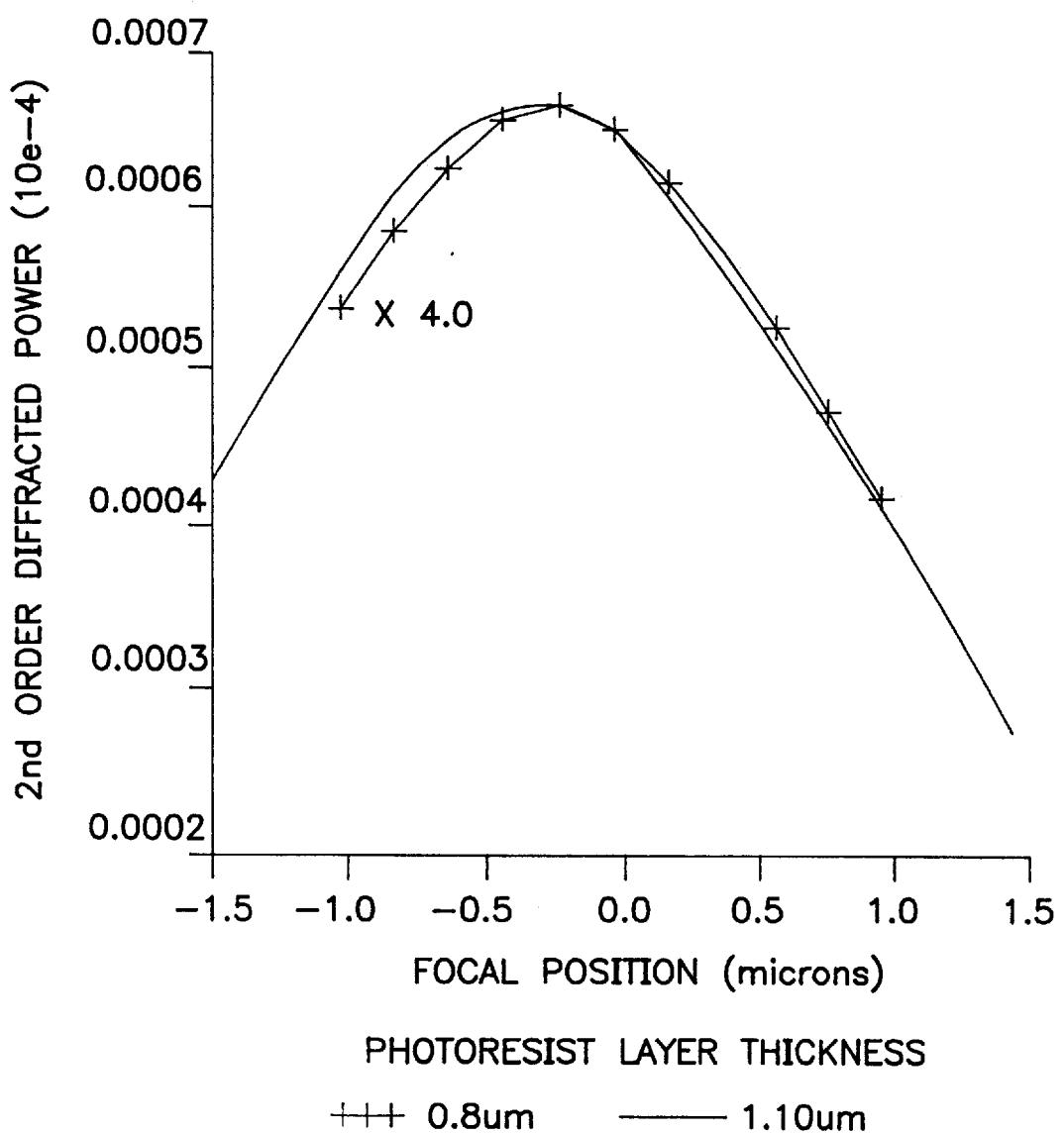
FIG. 5b is a plot of calculated 1st-order intensity versus focal position of light diffracted from a latent image structure, for photoresist of two different thicknesses.
Figure 5C:
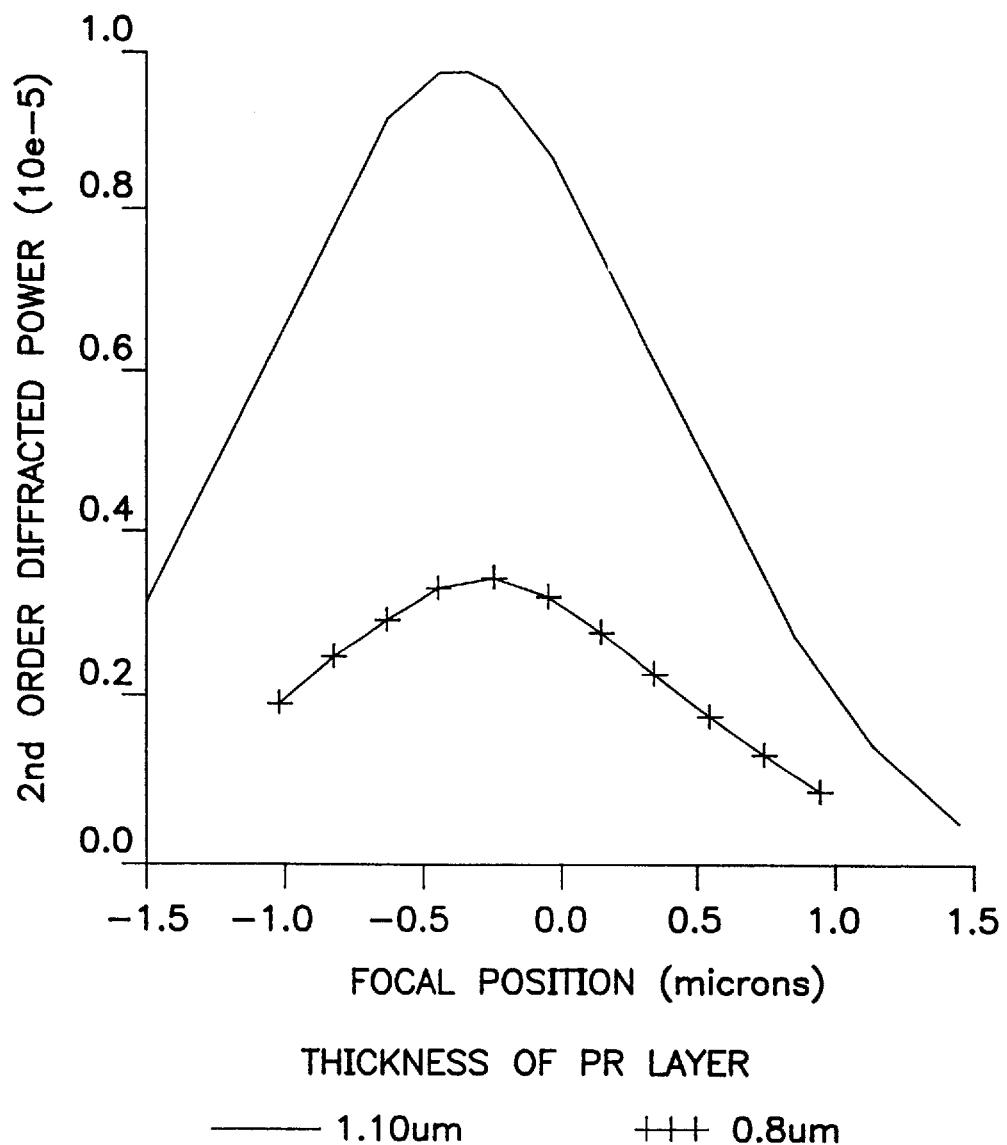
FIG. 5c is a plot of calculated 2nd-order intensity versus focal position of light diffracted from a latent image structure, for photoresist of two different thicknesses.

FIGS. 5a–5d illustrate the effects caused by variations in the optical thickness of the photoresist; similar results are realized if the underlying films changed in thickness, as discussed in afore-mentioned patent application Ser. No. 07/662,676 in connection with the diffracted light intensities. The intensities of the 0-, 1st- and 2nd-order diffracted beams are calculated in accordance with the method described above and in patent application Ser. No. 07/662,676 for photoresist thicknesses of 1.1 µm and 0.8 µm. FIG. 5a illustrates the change in 0-order intensity which can be used to detect and quantify the change in photoresist thickness as discussed in patent application Ser. No. 07/662,676. FIG. 5b illustrates the impact of the change in photoresist thickness on the 1st-order diffracted beam. Note that the intensity from the sample with 0.8 µm photoresist is scaled up by a factor of 4.0 to facilitate plotting. The peak which is observed for the sample with 0.8 µm of photoresist occurs at a focal position which is at a shallower depth in the photoresist than it does for the sample with 1.1 µm of photoresist. A similar but more pronounced and sharply defined behavior is observed for the 2nd-order diffracted intensity, as can be observed in FIG. 5c.

Figure 5D:
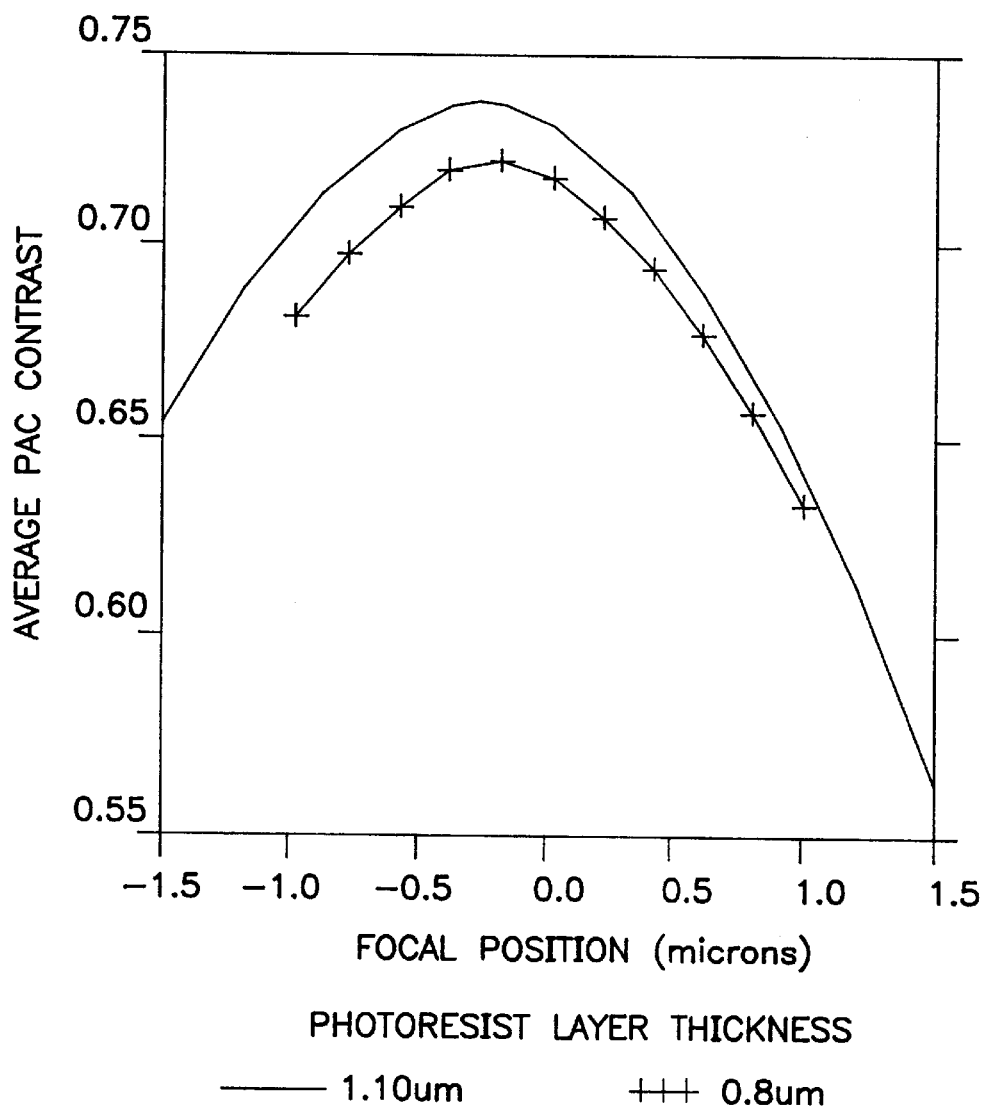
FIG. 5d is a plot of average contrast, $C_{avg}$, versus focal position in photoresist of two different thicknesses.
Figure 6:
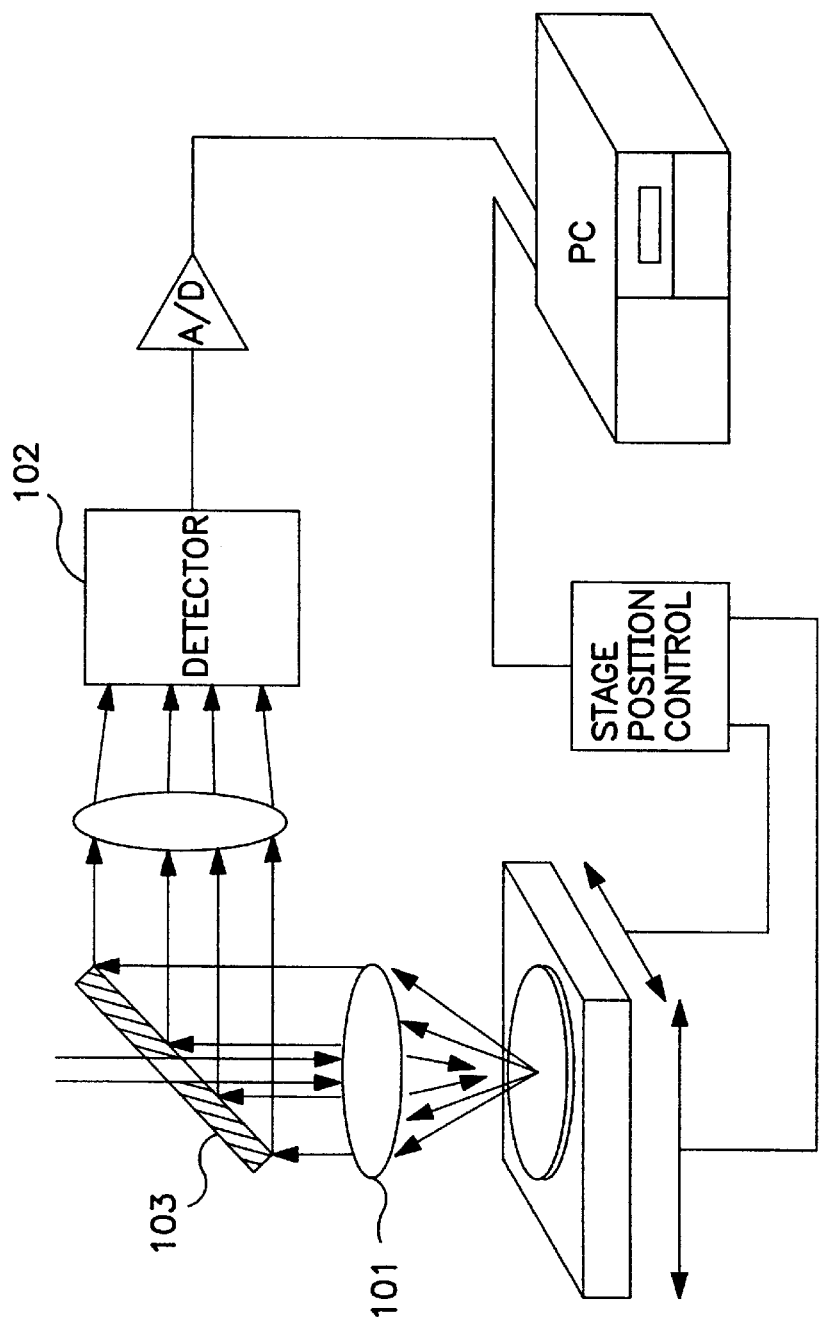
FIG. 6 is a diagrammatic view of a measuring arrangement in accordance with prior art.

FIG. 5d is a plot of $C_{avg}$ versus focal position for the same two samples. It can be seen that the sample with 0.8 μm of photoresist has a maximum $C_{avg}$ at a location which is closer to the top of the photoresist than the sample which has 1.1 μm of photoresist, consistent with the behavior illustrated in FIGS. 5b and 5c. This is also consistent with the experimental observations reported in the article cited earlier by C. A. Mack, 1988, in which it is reported that the optimal focal position is located at a position approximately ⅓ to ½ of the thickness of the photoresist from the top of the photoresist. If the photoresist becomes thinner, the optimal focal position is located a shorter distance from the top of the photoresist.

Application of the technique in accordance with the invention may be used for modeling in conjunction with measurements with an exposure tool in an "at-line" capability for process control as follows:

a. The periodic structure comprising a latent image is first modeled using the coupled wave analysis to theoretically predict the intensity of the beams that are diffracted. This step provides an accurate prediction of the intensity expected in the diffracted orders as a function of focus conditions and exposure time of the exposure tool and for an anticipated range of optical properties of the sample. This information may be stored, for example, in a table or computer memory for subsequent use.

b. The latent image structure which was modeled in step a is illuminated with laser output. The incident laser wavelength, angle, and polarization are chosen to provide optimal sensitivity of the technique. Preferably more than one set of experimental conditions are employed, thus providing a large amount of experimental data.

c. The intensity of diffracted light in the 0-order is measured to establish the optical thickness of the photoresist and transparent films which might exist on the sample. This measurement is performed either prior to or during photoresist exposure, because the intensity of this 0-order beam is not significantly influenced by the photoresist exposure. Two or more laser wavelengths may be used for this measurement to optimize the sensitivity as previously described in the aforementioned patent application Ser. No. 07/662,676.

d. The intensities of one or both of each of the ±1st-orders and ±2nd-orders are monitored during exposure. At the intensity levels predetermined by the analysis (a, above), the exposure is halted.

e. The intensities of one or both of each of the ±1- and ±2nd-orders are analyzed to determine the optimal focus conditions of the exposure tool. This information is used to adjust the focus conditions prior to exposing another structure.

f. If the anticipated or predetermined intensity levels for the diffracted orders are not detected, indication is provided that there is a process problem, such as an undesired film thickness or incorrect exposure level.

The laser beam may illuminate the die on the wafer at a large angle of incidence such that it is not directed through the projection lens of the stepper as discussed in patent application Ser. No. 07/662,676. Also, the incident laser beam may be directed at a die which is different from the one being exposed. In this case the laser might illuminate a die which had been exposed some number of steps previously. Monitoring a die this far removed from the one under exposure normally does not introduce excessive uncertainty, because this is consistent with the dimensions on a wafer over which optical properties change. These variations in the measurement technique may facilitate production.

If it is desired to closely monitor the results of this procedure during production, test samples which have approximately the same properties as those being fabricated by the process above can be characterized. The diffraction from latent images of the structures is measured, and the samples are developed and characterized using SEM techniques. This step is used to establish details of the photoresist structure and is useful information for monitoring the modeling procedure. Note that this step is not required on a routine basis, as this characterizes aspects of the lithography apparatus which are specific to the photoresist, pattern, and stepper which are used in the process, and these do not vary from sample-to-sample.

When utilizing the technique of the invention to analyze samples already exposed by the exposure tool, but undeveloped, such as an "off-line" analysis of "send-ahead" wafers which have been processed under a range, or matrix of exposure-focus conditions, the same steps a–f previously described are performed. These steps are all performed subsequent to the sample being exposed in the exposure tool.

We claim:

1. In microelectronics manufacturing, the method of determining the optimum location of the focal plane of an exposure tool to maximize the average image contrast when said exposure tool is used to form latent images having a periodic pattern in a photoresist film by a first incident radiation, said first incident radiation being within the sensitive spectrum of the photoresist and thereby being capable of exposing the photoresist film, comprising the steps of:

a) exposing a plurality of different regions of the photoresist to said periodic pattern to form a series of latent images, varying only the position of the focal plane of said exposure tool for each latent image so formed;

b) directing a second radiation on to each latent image so formed, said second radiation having a frequency outside the sensitive spectrum of the photoresist and having an intensity level;

c) measuring the intensity of one or more orders above the zero order of said second radiation diffracted from each latent image, thus obtaining a range of intensity measurements, each intensity measurement having a known relationship to the location in the photoresist of the focal plane of the exposure tool;

d) selecting said exposure tool focal plane position that corresponds to the maximum intensity of at least the first order of the diffracted beam from the range of intensities detected, this focal plane position then being that which will give the maximum image contrast.

2. The method of claim 1 wherein the intensities measured in c) are normalized to the intensity of the second radiation.

3. The method of claim 1 wherein said latent images are formed by exposing said photoresist to a periodic pattern of light by projecting said first radiation through a mask having a periodic pattern.

4. The method of claim 1 wherein said first radiation is ultraviolet and said second radiation is in the infrared or visible part of the spectrum.

5. The method of claim 1 wherein the angle of incidence of said second radiation is varied, said step of measuring including measuring the intensities of said one or more orders of diffracted radiation for each angle of incidence of the second incident radiation.

6. The method of claim 1 wherein the wavelength of said second radiation is varied, said step of measuring including measuring the intensities of said one or more orders of diffracted radiation for each wavelength of the second incident radiation.

7. The method of claim 1 wherein the angle of incidence of said second radiation is varied, said step of measuring including measuring the intensities of said one or more orders of diffracted radiation for each angle of incidence of the second incident radiation.

8. The method of claim 1 wherein the orders of diffracted radiation produced by the second radiation includes at least the first order.

* * * * *

UNITED STATES PATENT AND TRADEMARK OFFICE
CERTIFICATE OF CORRECTION

PATENT NO. : 5,830,611
DATED : November 3, 1998
INVENTOR(S) : Bishop et al.

It is certified that error appears in the above-identified patent and that said Letters Patent is hereby corrected as shown below:

At Column 1, line 4, insert --This invention was made in the performance of work under contracts with Sandia National Laboratories, Contract No. SD-5167, and the U.S. Department of Energy, Contract No. S-76,380.--

Signed and Sealed this

First Day of May, 2001

Attest:

NICHOLAS P. GODICI

Attesting Officer    Acting Director of the United States Patent and Trademark Office